(12) United States Patent
Gulbransen et al.

(10) Patent No.: US 11,871,131 B2
(45) Date of Patent: Jan. 9, 2024

(54) FOVEAL COMPRESSIVE UPSAMPLING

(71) Applicant: Raytheon Company, Waltham, MA (US)

(72) Inventors: David J. Gulbransen, Fairview, TX (US); Jae H. Kyung, Redondo Beach, CA (US); Chaffra A. Affouda, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 188 days.

(21) Appl. No.: 17/396,436

(22) Filed: Aug. 6, 2021

(65) Prior Publication Data

US 2023/0045356 A1 Feb. 9, 2023

(51) Int. Cl.
*H04N 25/702* (2023.01)
*G06T 3/40* (2006.01)
*H04N 25/75* (2023.01)

(52) U.S. Cl.
CPC .............. *H04N 25/702* (2023.01); *G06T 3/40* (2013.01); *H04N 25/75* (2023.01)

(58) Field of Classification Search
CPC ......... H04N 25/702; H04N 25/75; G06T 3/40
See application file for complete search history.

(56) References Cited

U.S. PATENT DOCUMENTS

| | | | |
|---|---|---|---|
| 7,532,772 B2 | 5/2009 | Brady | |
| 9,124,755 B2 * | 9/2015 | Kelly | ..................... H04N 19/90 |
| 9,445,115 B2 | 9/2016 | DeWeert et al. | |
| 9,983,063 B1 | 5/2018 | Tener et al. | |
| 10,198,790 B1 * | 2/2019 | Owechko | ............. H04N 5/2624 |
| 2006/0038705 A1 | 2/2006 | Brady et al. | |
| 2019/0110053 A1 * | 4/2019 | Varia | .................... H04N 19/174 |
| 2019/0206369 A1 * | 7/2019 | Kempf | .................... G06F 3/013 |
| 2021/0136397 A1 * | 5/2021 | Lakshmikantha | ...... H04L 43/08 |
| 2021/0168315 A1 | 6/2021 | Cook | |

* cited by examiner

*Primary Examiner* — Twyler L Haskins
*Assistant Examiner* — Angel L Garces-Rivera

(57) ABSTRACT

An apparatus includes a sensor having an array of detectors. The sensor is configured to assign multiple detectors to a detector group corresponding to a block pixel. The sensor is also configured, for each frame of a set of frames, to apply a specified one of a set of mask patterns in order to select outputs of the detectors in the detector group and aggregate the selected outputs of the detectors in the detector group to determine pixel information for the block pixel. The apparatus also includes at least one processor configured to generate the frames using the pixel information for the block pixel, and upscale the portion of the at least one of the frames using the set of mask patterns to identify native pixels within the block pixel.

20 Claims, 7 Drawing Sheets

FOVEAL COMPRESSIVE UPSAMPLING

GOVERNMENT RIGHTS

This invention was made with U.S. government support under contract number FA8650-21-C-7046 awarded by the U.S. Air Force. The U.S. government has certain rights in this invention.

TECHNICAL FIELD

This disclosure relates generally to imaging devices and processes. More specifically, this disclosure relates to foveal compressive upsampling for imaging devices and processes.

BACKGROUND

Wide-area persistent surveillance at high resolutions often involves the use of a large number of effective frame pixels. Capturing high-resolution data at video rates or higher frame rates can result in high sensor-to-system data rates and high power dissipation rates. For cooled sensors, this can easily exceed the capacity of cryocoolers or other cooling systems.

SUMMARY

This disclosure provides foveal compressive upsampling for sensor and focal plane array device and processes.

In a first embodiment, an apparatus includes a sensor having an array of detectors. The sensor is configured to assign multiple detectors to a detector group corresponding to a block pixel. The sensor is also configured, for each frame of a set of frames, to (i) apply a specified one of a set of mask patterns in order to select outputs of the detectors in the detector group and (ii) aggregate the selected outputs of the detectors in the detector group to determine pixel information for the block pixel. The apparatus also includes at least one processor configured to generate the frames using the pixel information for the block pixel, and upscale a portion of the at least one of the frames using the set of mask patterns to identify native pixels within the block pixel.

In a second embodiment, a method includes receiving frame data from a sensor having an array of detectors. The sensor is configured to assign multiple detectors to a detector group corresponding to a block pixel. The sensor is also configured, for each frame of a set of frames, to (i) apply a specified one of a set of mask patterns in order to select outputs of the detectors in the detector group and (ii) aggregate the selected outputs of the detectors in the detector group to determine pixel information for the block pixel. The method also includes generating the frames using the pixel information for the block pixel. In addition, the method includes upscaling a portion of the at least one of the frames using the set of mask patterns to identify native pixels within the block pixel.

In a third embodiment, a non-transitory computer readable medium contains instructions that when executed cause at least one processor to receive frame data from a sensor having an array of detectors. The sensor is configured to assign multiple detectors to a detector group corresponding to a block pixel. The sensor is also configured, for each frame of a set of frames, to (i) apply a specified one of a set of mask patterns in order to select outputs of the detectors in the detector group and (ii) aggregate the selected outputs of the detectors in the detector group to determine pixel information for the block pixel. The medium also contains instructions that when executed cause the at least one processor to generate the frames using the pixel information for the block pixel. In addition, the medium contains instructions that when executed cause the at least one processor to upscale a portion of the at least one of the frames using the set of mask patterns to identify native pixels within the block pixel.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 5, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As discussed above, wide-area persistent surveillance at high resolutions often involves the use of a large number of effective frame pixels. Capturing high-resolution data at video rates or higher frame rates can result in high sensor-to-system data rates and high power dissipation rates. For cooled sensors, this can easily exceed the capacity of cryocoolers or other cooling systems. Typically, this cooling discrepancy is addressed by using multiple independent cameras with overlapping fields of view or by scanning a single camera over the desired field of view in a series of steps. However, these approaches either create large complex systems or have relatively slow revisit rates for the full field of view.

This disclosure provides various approaches for foveal compressive upsampling in which a focal plane array (FPA) or other sensor array is divided into groups of detectors whose outputs are capable of being assigned to a detector group that corresponds to a block pixel. For each image frame captured, one of a set of mask patterns is applied to determine which outputs of the detectors in the group are aggregated. A compressive sensing algorithm (such as Hadamard encoding or other approach) can be used to reconstruct the full resolution of the image frame while offering significant compression of the data transmitted from the sensor array. The amount of foveation can vary across or within the array, such as when one or more regions provide image data at a full native pixel resolution while other regions can be compressed (such as by four, sixteen, or sixty-four times in area). Note that the image frames describe here can refer to preview images that are constantly updated on a user interface, image frames for a video sequence, or other images.

Figure 1:
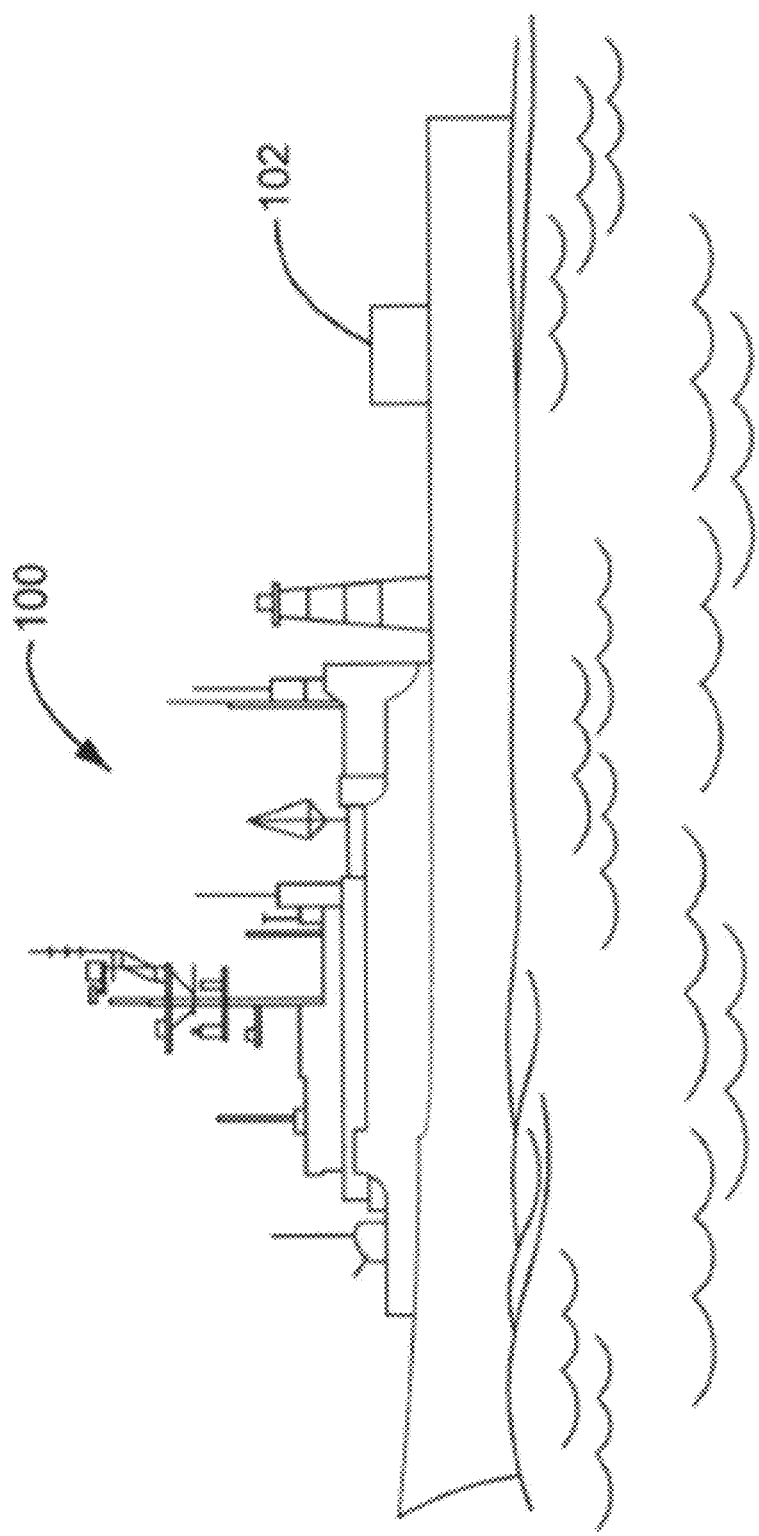
FIG. 1 illustrates an example vehicle with a sensor system having a coded aperture focal plane array (FPA) in accordance with this disclosure.

FIG. 1 illustrates an example vehicle 100 with a sensor system 102 having a coded aperture focal plane array (FPA) in accordance with this disclosure. In this example, the vehicle 100 represents a naval vessel. However, the sensor system 102 may be used with any other suitable type of ground, air, water, or space vehicle. Also, the sensor system 102 may be used separate from any vehicle. Thus, the sensor system 102 may be applicable to various vehicles, buildings, structures, geographical areas, and the like.

In this example, the sensor system 102 is also described as containing a focal plane array. However, the sensor system 102 may use any other suitable type of detector array. The sensor system 102 has a field of view (FOV) that can provide some level of situational awareness for the vehicle 100. In some embodiments, the sensor system 102 provides hemispherical ($2\pi c$ steradians) situational awareness at a relatively high resolution to detect and track potential threats. However, any desired field of view can be provided by the sensor system 102 to meet the needs of a particular application. In some embodiments, a portion of a field of view can be the focus of the sensor system 102 for enhanced resolution.

Although FIG. 1 illustrates one example of a vehicle 100 with a sensor system 102 having a coded aperture focal plane array, various changes may be made to FIG. 1. For example, a system may include any number of sensors with any number of detector arrays in any suitable configuration.

Figure 2:
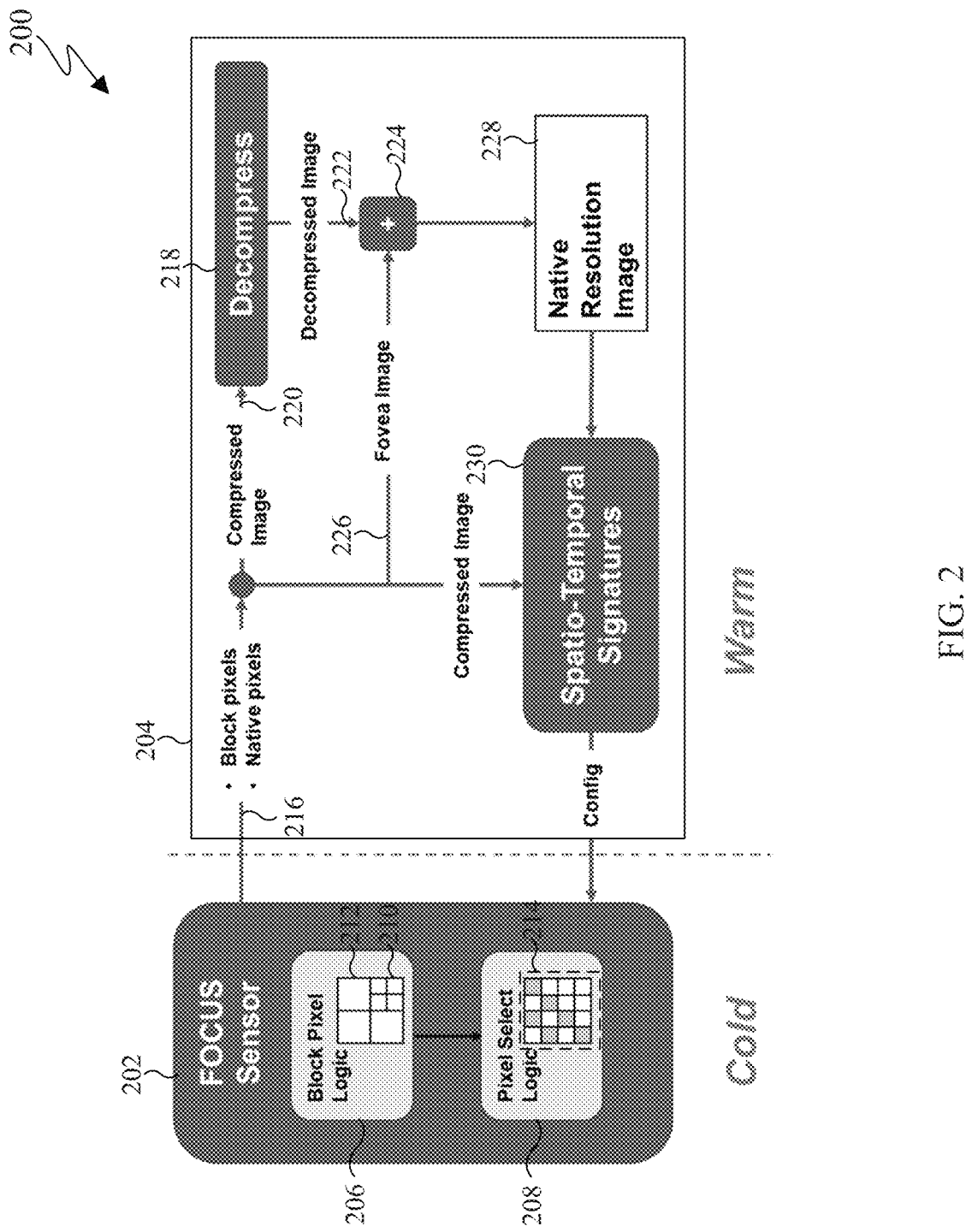
FIG. 2 illustrates an example foveal compressive upsampling (FOCUS) camera system in accordance with this disclosure.

FIG. 2 illustrates an example foveal compressive upsampling (FOCUS) camera system 200 in accordance with this disclosure. The camera system 200 may, for example, be used to form at least a part of the sensor system 102 of FIG. 1. For ease of explanation, the camera system 200 may therefore be used with the vehicle 100 of FIG. 1. However, the camera system 200 may be used in any other suitable manner.

As shown in FIG. 2, the camera system 200 includes one or more FOCUS sensors 202 and one or more processors 204. The camera system 200 is capable of capturing frames using foveal processing techniques in order to reduce power consumption, data output rates, and cooling requirements. Each sensor 202 represents an optical sensor with hardware for determining pixel information. In this example, the sensor 202 includes block pixel logic function 206 and pixel select logic function 208. Both of the block pixel logic function 206 and the pixel select logic function 208 can be provided in the sensor using hardware or using software/firmware instructions executed using hardware. In some embodiments, the sensor 202 can receive an identification of a region of interest or field of view from a user, and this information can be used to determine the region of interest of an imaging array.

The block pixel logic function 206 can use the region of interest of the imaging array to configure a grouping of different detectors in a detector array to reduce an amount of information required to be processed and transmitted. For example, the block pixel logic function 206 can configure one or more native pixels 210 and one or more block pixels 212 to be used by the imaging array. A native pixel 210 represents a pixel that uses the output from only one detector, and the reading from that one detector identifies the characteristic(s) of the pixel. A block pixel 212 represents a pixel in which more than one detector identifies the characteristic(s) of the pixel.

Depending on the circumstances, the block pixel logic function 206 can configure some detectors in the imaging array to sample a more detailed portion of a scene or to detect movement in a scene. In these instances, the block pixel logic function 206 may use larger pixels 212 for areas that are low in detail or stagnant (such as the sky, water, etc.). The block pixel logic function 206 is described in greater detail below in FIGS. 4A and 4B. In some embodiments, the block pixel logic function 206 can identify or receive a field of view and identify the native pixels 210 and block pixels 212 based on the field of view.

The pixel select logic function 208 can determine masking patterns 214 for use in selecting outputs from the detectors in a detector group in order to generate the associated block pixel 212. The masking patterns 214 are a determination of which detectors in the detector group are read for a specific image frame being generated using the block pixel 212. The masking patterns 214 allow for a reduced amount of processing and transmission of information from the detectors related to the block pixel 212 in the imaging array. The masking pattern 214 can change for each image frame, allowing multiple image frames to be generated using multiple masking patterns 214. In some cases, the number of masking patterns 214 used matches the number of detectors in the detector group. Thus, for a block pixel 212 with a 2×2 detector group, the pixel select logic function 208 can create or utilize at least four masking patterns 214 in order to maintain the information of each detector in the 2×2 detector group. For a block pixel 212 with a 4×4 detector group, the pixel select logic function 208 can create or utilize at least sixteen masking patterns 214 in order to maintain the information of each detector in the 4×4 detector group. The masking patterns 214 can be repeated in a sequential order for the specified detector group size.

During operation, the sensor 202 can capture one or more native pixels 210 and one or more block pixels 212. Pixel information 216 related to the native pixels 210 and the block pixels 212 is output to the processor 204 for further processing, such as for use in generating images for display, storage, or other use. The pixel information 216 can include information related to each captured pixel (native or block). For example, information for a block pixel 212 can include a color along with a specific masking pattern 214 used for a specific frame. The pixel information 216 can be used to process a decompressed frame 220 and a fovea frame 226 (a region of the imaging array composed of native pixels). Note that, for a block pixel 212, the sensor 202 may only output pixel information 216 related to the block pixel overall and not individual information for each detector of the block pixel 212. The sensor 202 may also only store, in a memory, pixel information 216 related to the block pixel overall and not individual information for each detector of the block pixel 212. Native pixels 210 may still involve the storage, output, or processing of information from an individual detector.

A decompress function 218 receives a compressed frame 220 from initial processing of the pixel information 216 and generates a decompressed frame 222 from the received compressed frame 220. The decompress function 218 can utilize the pixel information 216 related to the block pixel 212 and the masking patterns 214 for upsampling the compressed frame 220 to produce the decompressed frame 222. Information related to each detector included in the detector group for a block pixel 212 can be deduced from the pixel information 216 of that block pixel 212 and the masking patterns 214 for a series of frames. In some cases, the information related to each detector can be averaged over the frames in which the detector was not masked to determine specific characteristics associated with the detector.

The processor 204 can also include an additive function 224. The additive function 224 can use a fovea frame 226 processed from the pixel information 216 and the decompressed frame 222 processed from the decompress function 218 to generate a native resolution frame 228. The native resolution frame 228 is a frame where specific information for each detector is reproduced in a full frame instead of using the general information of a block pixel 212.

The native resolution frame 228 may include an abnormal spatio-temporal signature or other artifact(s) due to movement or greater detail in specific areas of the frame where block pixels 212 have been implemented. Because the information in the native resolution frame is averaged for each detector in a detector group corresponding to a block pixel 212, artifacts can appear due to movement. For example, an object moving quickly across a scene may cause a "streak" or a line for a movement path of the object in the native resolution frame 228. A spatio-temporal signatures function 230 can identify these artifacts as being "anomalous" or not intended parts of the frame, and the spatio-temporal signatures function 230 can provide configuration information 232 to the sensor 202 in order to help reduce or eliminate these artifacts. The configuration information 232 can include changes for the block pixel logic function 206 to adjust block pixels 212 that require more detail. For instance, when a blurred object is identified, the spatio-temporal signature function 230 can determine that there is significant movement in a small area, and the spatio-temporal signatures function 230 can provide the location of the blurred object to the sensor 202 so that the block pixel logic function 206 can change the associate pixels in that area from block pixels 212 to a different block pixel configuration or to native pixels 210.

The processor 204 can also use the masking patterns 214 to determine the color for each individual selected detector in a block pixel 212. Based on the pixel information 216 for the block pixel 212 associated with a detected abnormality, the processor 204 can retroactively upscale the frame. Although the processor 204 does not have access to and does not receive pixel information 216 for individual detectors in a detector group corresponding to a block pixel 212, the processor 204 can determine a pixel value based on the block pixel 212 and the masking pattern 214 from the pixel select logic function 208. The processor 204 can use the masking pattern 214 applied to a block pixel 212 to upscale a frame after being received.

Although FIG. 2 illustrates one example of a FOCUS camera system 200, various changes may be made to FIG. 2. For example, the sizes, shapes, and dimensions of the camera system 200 and its individual components can vary as needed or desired. Also, the number and placement of various components of the camera system 200 can vary as needed or desired. In addition, the camera system 200 may be used in any other suitable foveal process and is not limited to the specific processes described above.

Figure 3:
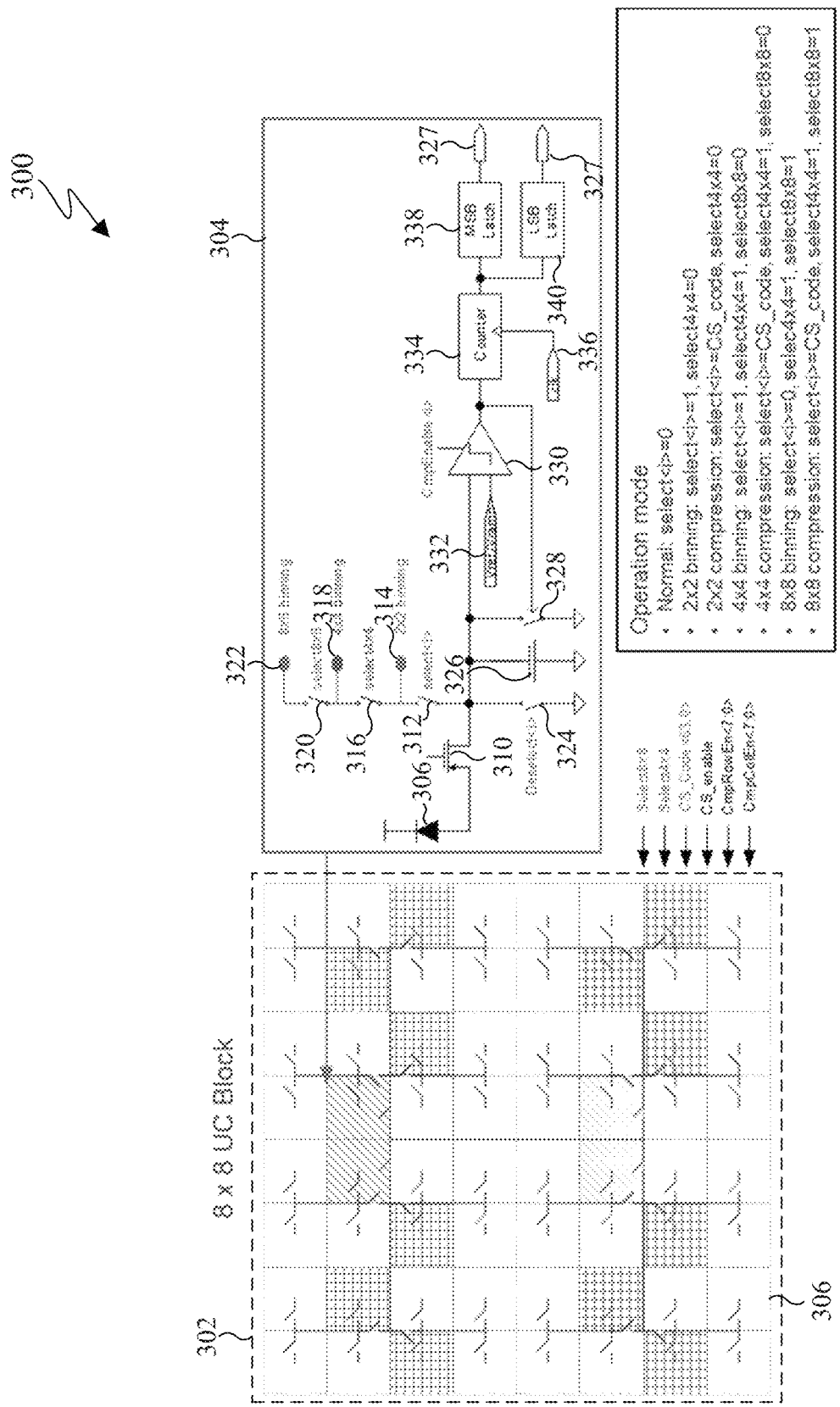
FIG. 3 illustrates an example hierarchical binning upsampling compression (UC) readout integrated circuit (ROIC) in accordance with this disclosure.

FIG. 3 illustrates an example hierarchical binning upsampling compression (UC) readout integrated circuit (ROIC) 300 in accordance with this disclosure. The ROIC 300 may, for example, be used in the sensor system 102 and/or the camera system 200. However, the ROIC 300 may be used in any other suitable device or system.

As shown in FIG. 3, the ROIC 300 can be used in different operating modes for foveal compressive upsampling. In this example, the ROIC 300 is used in conjunction with a detector array 302, which includes an array of detectors 306. In some embodiments, the detector array 302 includes an m×m array of detectors 306 (where m≥2), which may allow for the capture of up to m×m pixels. However, as described above, multiple detectors 306 may be grouped into a detector group for a block pixel. Each detector 306 represents an imaging sensor, such as an infrared, visible, or ultraviolet photodetector. The ROICs 300 operate by accumulating photocurrents from respective detectors 306 and transferring the resultant signals onto output taps for readout.

In this example, each detector 306 includes an input circuit 304 that is used to accumulate a charge generated from the associated photodetector. The charge is used to determine the characteristic(s) for the pixel associated with the detector 306. The detectors 306 can be formed and arranged in any suitable manner for capturing a desired field of view. The detectors 306 can also be grouped into any suitable number of detector groups assigned to any suitable number of block pixels 212 or be individually assigned as any suitable number of native pixels 210. The detector groups can be assigned a set of masking patterns 214 for use sequentially and repeatedly during operation of the sensor 202.

Note that the number and/or the size of the detectors 306 can be used to meet the needs for a particular application. Thus, for example, the number of rows of detectors 306 may or may not equal the number of columns of detectors 306. Also, while diode-based detectors 306 are used here, it is understood that any suitable type(s) of detector(s) can be used, including dual or multi-color detector diodes or avalanche photo diodes. Each detector 306 can be sensitive to any suitable wavelength(s) of light.

It will also be understood that while each input circuit 304 shown is a direct injection (DI) type circuit, other classes of detector input circuits may be used, such as a charge transimpedance amplifier (CTIA), a source follower per detector (SFD), gate modulation, etc. Also, the DI circuit shown (as well as the other circuits) may include an in-pixel sample/hold circuit or other noise reduction circuitry, such as correlated double sampling. The DI circuit shown may also be a dual polarity circuit allowing a bias selectable two-color detector to be used. In the specific embodiment illustrated in FIG. 3, the input circuit includes an in-pixel analog-to-digital converter including comparator 304, counter 334, and digital latches 338 and 340.

A ROIC pixel is output via the input circuit 304 for each of the detectors 306. Each input circuit 304 in this example includes an input transistor 310, a 2×2 selection switch 312, a 2×2 binning connection 314, a 4×4 selection switch 316, a 4×4 binning connection 318, an 8×8 selection switch 320, an 8×8 binning connection 322, a deselect switch 324, an integration capacitor 326, a pixel digital output 327, a reset switch 328, a comparator 330, a reference level 332, a counter 334, a clock input pin 336, a most significant bit (MSB) latch 338, and a least significant bit (LSB) latch 340. The input transistor 310 can act as a buffer for the associated detector 306. For example, the input transistor 310 may provide a constant bias on the corresponding detector 306 to minimize its effects on neighboring detectors 306.

The 2×2 selection switch 312 is a switch that selectively links the detector 306 to the 2×2 binning connection 314. The 2×2 selection switch 312 can be switched off for normal mode and switched on for all other modes. The 2×2 binning connection 314 is a connection for an accumulation of four detectors 306 in a detector group for a block pixel 212. The 4×4 selection switch 316 is a switch that selectively links the detector 306 to the 4×4 binning connection 318. The 4×4 selection switch 316 is located after the 2×2 selection switch 312 from a junction node and can be switched off for normal mode and 2×2 mode but switched on for all other modes. The 4×4 binning connection 318 is a connection for an accumulation of sixteen detectors 306 for a block pixel 212. The 8×8 selection switch 320 is a switch that selectively links the detector 306 to the 8×8 binning connection 322. The 8×8 selection switch 320 is located after the 2×2 selection switch 312 and the 4×4 selection switch 316 from the junction node, and the 8×8 selection switch 320 can be switched off for normal mode, 2×2 mode, and 4×4 mode but switch on for all other modes. The 8×8 binning connection is a connection for an accumulation of sixty-four detectors 306 for a block pixel 212.

Note that while options up to an 8×8 mode are illustrated here, any number of additional modes can be added to the input circuit 304. For each additional mode, an additional selection switch and an additional binning connection can be added in series after the 8×8 selection switch 320. The 2×2 selection switch 312, the 4×4 selection switch 316, and the 8×8 selection switch 320 can be used for selecting specific detectors 306 in the detector array 302 for use as native pixels 210 and/or block pixels 212.

In some embodiments, each of the detectors 306 can be selected or deselected at a given time. When a detector 306 is deselected, its deselection switch 324 is switched to connect a junction point to a ground source in order to draw any electrical pulses away from other components of the ROIC 300. In some embodiments, deselected detectors 306 are tied to a bias signal in order to shunt their photocurrents and reduce interference with neighboring detectors 306. As described more fully below, detectors 306 are selected and deselected to form desired patterns for generating outputs that can be processed in accordance with computational imaging techniques. A select module can be located within the ROIC pixel or may be located in the periphery of the ROIC (outside the pixel area).

The integration capacitor 326 can be selectively coupled to a detector 306 by one of the 2×2 selection switch 312, the 4×4 selection switch 316, and the 8×8 selection switch 320. The integration capacitor 326 is connected to an input of the comparator 330 and the 2×2 selection switch 312, the 4×4 selection switch 316, and the 8×8 selection switch 320. The pixel output 327 outputs pixel information to the processor 204 for further processing. For example, the pixel output 327 may provide pixel information 216 to the processor 204.

The reset switch 328 is connected to an input of the comparator 330 and to ground, and the reset switch 328 is controlled by an output of the comparator 330. The reset switch 328 is enabled when the comparator 330 determines that the integration capacitor 326 has been charged by at least a threshold amount. When the reset switch 328 is enabled, the integration capacitor 326 discharges its stored electrical charge. One input of the comparator 330 is connected to the integration capacitor 326, and the other input of the comparator 330 is connected to a threshold voltage or reference level 332. The comparator 330 changes output state when the voltage stored on the integration capacitor 326 meets or exceeds the reference voltage 332?

The counter 334 counts the number of times that the comparator 330 indicates the voltage stored on the integration capacitor 326 meets or exceeds the reference voltage 332. In some embodiments, the counter 334 uses a gray code, which is a binary numeral system where two successive values differ in only one bit (one binary digit). However, the counter 334 may utilize other digital counting schemes. The counter 334 may support any desired number of bit widths, such as 14-bit or 16-bit values. The counter 334 and the ROIC 300 may share a common reset signal to ensure that they are synchronized. For example, the reset signal can reset the ROIC 300 by closing the reset switch 328.

The counter 334 is connected to a clock input pin 336, which may be dedicated to the counter 334 or used with other components of the ROIC 300. The clock input pin 336 can receive a clock signal for the counter 334 and possibly other components of the ROIC 300. An output value from the counter 334 can be received by the MSB latch 338 and the LSB latch 340. The MSB latch 338 tracks the highest bit value(s) output by the counter 334, and the LSB latch 340 tracks the lowest bit value(s) output by the counter 334. The processor 204 can read the MSB latch 338 and the LSB latch 340 to determine the counter value for the integration window.

In operation, during an integration window, one or more of the switches 312, 316, and 320 are closed, and the reset switch 328 is open. During this time, a voltage builds across the integration capacitor 326 due to its connection to at least one detector 306. The comparator 330 can reset the voltage across the integration capacitor 326 if and when the voltage meets or exceeds the reference level 332, and the counter 334 can count the number of times that this occurs. After the integration window expires, one or more of the switches 312, 316, and 320 are opened, and the integrated value (the value output by the counter 334) can be read out as described more fully below. As such, the ROIC 300 can be considered an "integration then read" type of ROIC.

Although FIG. 3 illustrates one example of a hierarchical binning UC ROIC 300, various changes may be made to FIG. 3. For example, the sizes, shapes, and dimensions of the ROIC 300 and its individual components can vary as needed or desired. Also, the number and placement of various components of the ROIC 300 can vary as needed or desired. In addition, the ROIC 300 may be used in any other suitable foveal process and is not limited to the specific processes described above.

Figures 4A, 4B, 4C:
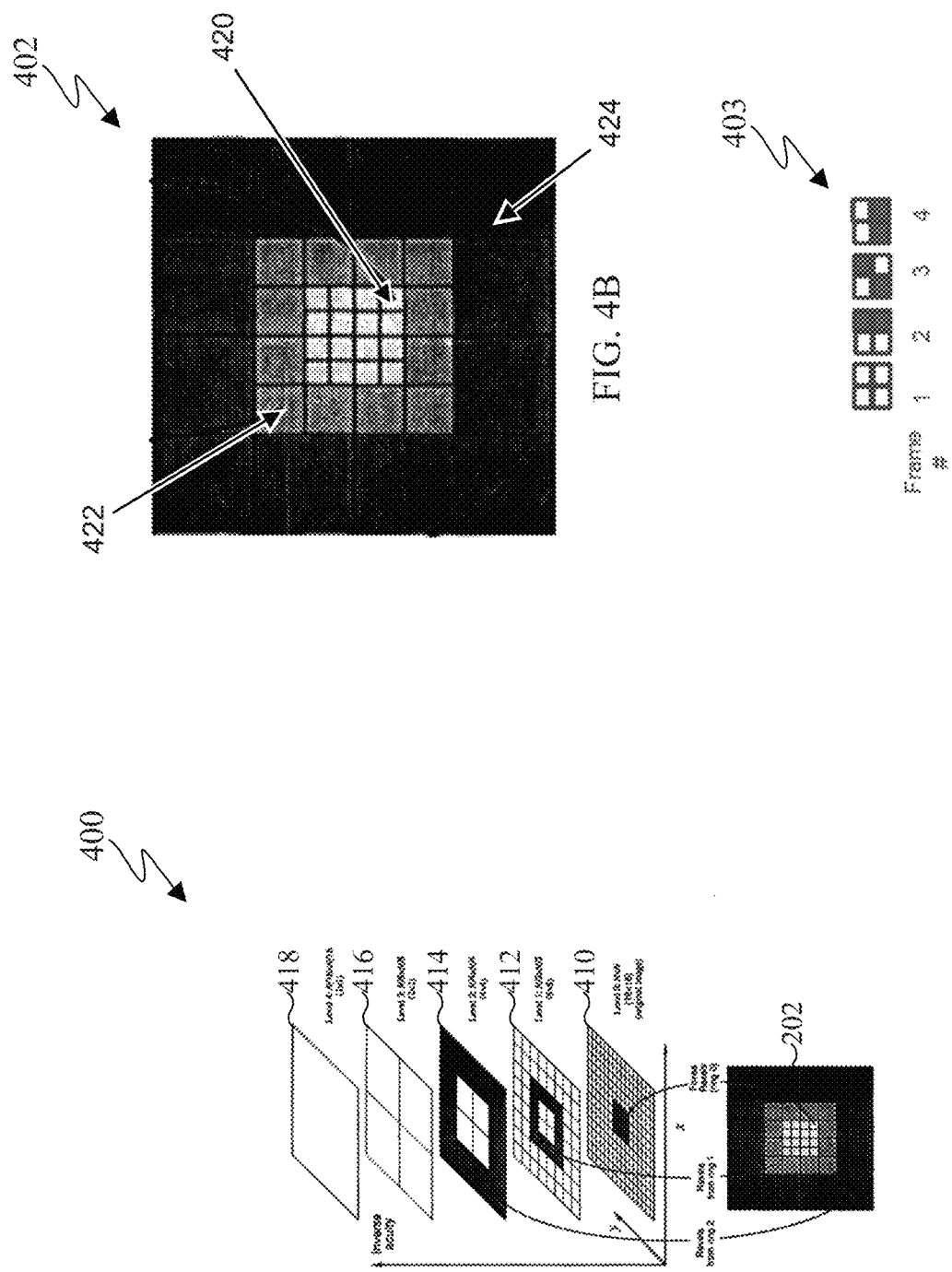
FIGS. 4A through 4F illustrate examples of fovea and compressive sampling in accordance with this disclosure.
Figure 4D:
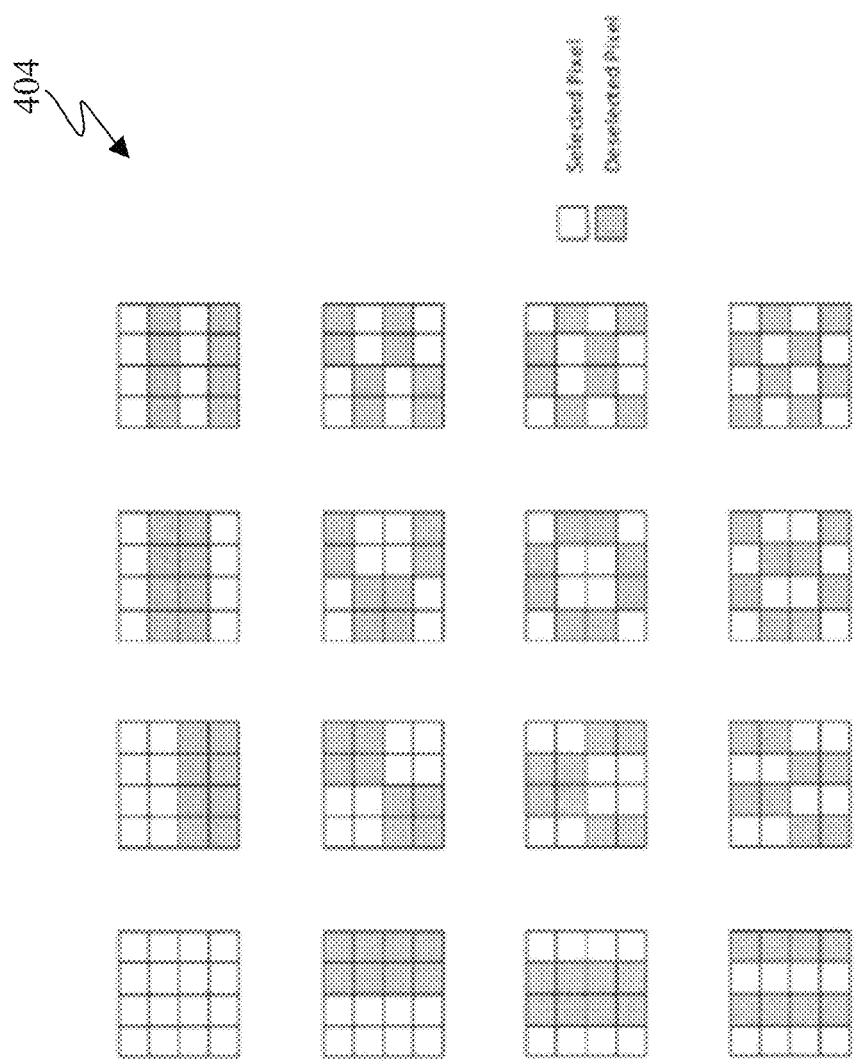
Figure 4E:
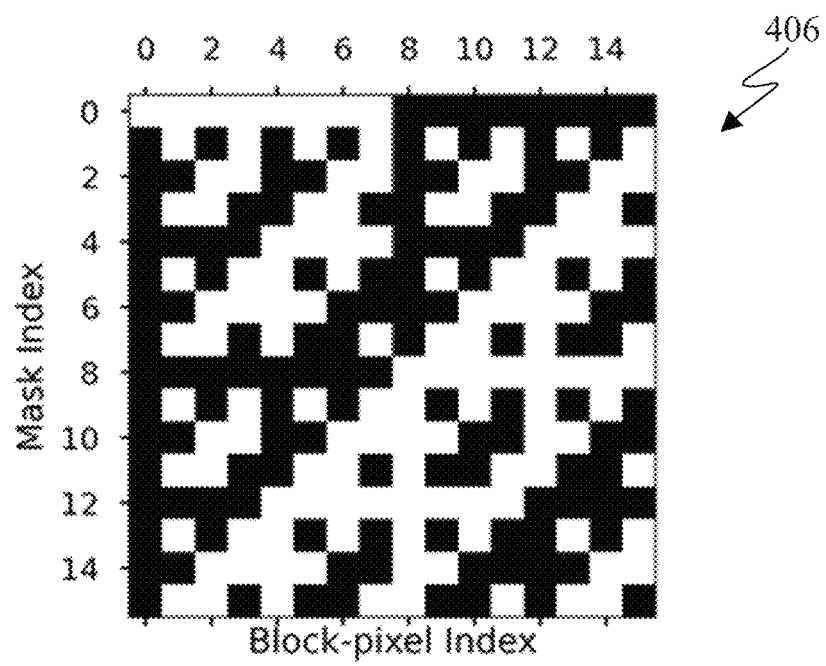
Figure 4F:
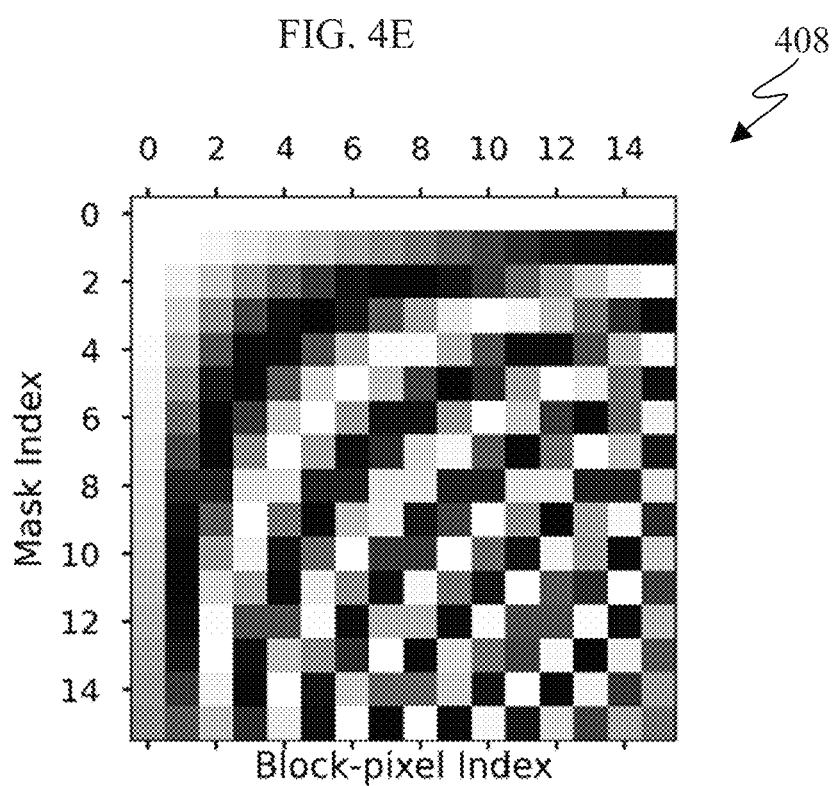

FIGS. 4A through 4F illustrate examples of fovea and compressive (Hadamard) sampling in accordance with this disclosure. In particular, FIG. 4A illustrates an example foveal hierarchical pyramid data structure 400, FIG. 4B illustrates an example compressive sampling 402, FIG. 4C illustrates an example macro-pixel sampling 403, FIG. 4D illustrates an example micro-pixel sampling 404, FIG. 4E illustrates an example Hadamard base mask matrix 406, and FIG. 4F illustrates an example discrete cosine transform (DCT) mask matrix 408.

As shown in FIGS. 4A and 4B, a foveal hierarchical pyramid data structure 400 is provided for preparing a compressive sampling 402 for processing frames. The foveal hierarchical pyramid structure 400 includes multiple refinement levels. In the illustrated embodiment, the foveal hierarchical pyramid data structure 400 includes five refinement levels, although other numbers of refinement levels may be used. At an original frame level 410, each square represents a pixel that can correspond to a detector in a detector array. For example, the original frame level 410 can include a 16×16 detector array corresponding to 256 pixels.

At each additional level 412-418, the pixel count is reduced by half for each row and each column. In the illustrative example, a first reduction level 412 can use the 16×16 detector array to define an 8×8 pixel array, where each pixel would be defined based on a 2×2 group of detectors from the detector array. A second reduction level 414 can include 4×4 pixel array, where each pixel is defined by a 4×4 group of detectors. A third reduction level 416 can include a 4×4 pixel array, where each pixel is defined by an 8×8 group of detectors. A fourth reduction level can include a single pixel defined by the 16×16 detector array. It is understood that the foveal hierarchical pyramid data structure shown here is for illustrative purposes and different scaling of pixel groups can be used wherein each successive groups can grow for an example, linearly, geometrically or exponentially and may extend arbitrarily within the imaging array.

A compressive sampling 402, such as a Hadamard compressive sampling, can be generated using portions of different levels from the foveal hierarchical pyramid data structure 400. The compressive sampling 402 can be formed with a center fovea 420, an intermediate fovea 422, and an outer fovea 424. The foveae 420-424 can have pixel concentrations based on different levels of the foveal hierarchical pyramid data structure 400. For example, the center fovea 420 can have a full resolution at the original frame level. The center fovea 420 can be a 4×4 pixel array utilizing a 4×4 portion of the detector array. It is understood that the different levels of fovea do not need to be nested as illustrated in FIG. 4B and may be placed independently from other fovea levels within the imaging array.

The intermediate fovea 422 can be a one-pixel border around the center fovea 420, where each pixel from the intermediate fovea 422 is from the first reduction level 412 and is defined by a 2×2 detector group. The intermediate fovea 422 can be a two-times down-sampled region with a 2×2 macro-pixel sampling 403. As shown in FIG. 4C, the pixels for the intermediate fovea 422 can be determined based on utilizing a different number of detectors or different patterns of detectors within the 2×2 detector group. For example, a pattern for a first frame can indicate that information is captured from each of the detectors in the 2×2 detector group. A pattern for a second frame can indicate that information is captured from each of the detectors in one column of the 2×2 detector group. A pattern for a third frame can indicate that information is captured from detectors in different rows or different columns of the 2×2 detector group. A pattern for a fourth frame can indicate that information is captured from each of the detectors in one row of the 2×2 detector group. The patterns of the four frames here can be repeated in the same order, which allows the information of each detector to be recovered after the information for the pixel is saved.

The outer fovea 424 can be a one-pixel border around the intermediate fovea 422, where each pixel in the outer fovea is from the second reduction level 414 and is defined by a 4×4 detector group. As shown in FIG. 4D, encoded masks define which of sixteen detectors can be used in various combinations. Note that while sixteen aperture masks are shown here, it will be understood that any practical number and type of masks can be used to meet the needs of a particular application. In addition, the number of selected/deselected detectors for the masks in the sequence can vary. In the illustrated masks, except for a first mask in the upper left corner in which all detectors are selected, half of the detectors are selected and half of the detectors are deselected in each of the remaining masks. The sensor system 102 may sequence through these masks in a repeating manner. In some embodiments, the detector select logic for the masks is programmable. In other embodiments, the select logic is hardcoded.

By sequencing through the masks and selecting and deselecting detectors in a known manner, information from the individual detectors can be obtained instead of just the aggregated detector information. The array output from each mask can be processed using computational imaging techniques to increase the resolution of the array. For example, a 8,192×8,192 focal plane array can be created while only reading out 1,024×1,024 pixels in any given frame (although other sizes of imaging arrays and sizes of read outs may be used). It will be understood that other computational imaging techniques may be applied to exploit the mask patterns for other applications, such as event detection, motion target indication, and passive depth imaging. In some embodiments, the mask patterns can be changed at the frame rate. In addition, coded aperture resolution enhancements can be applied to a number of smaller regions of interest in the field of view to reduce the computational bandwidth.

As shown in FIG. 4E, a sample Hadamard base mask matrix 406 can be prepared to identify the masks that are active for each frame. Each row of the Hadamard base mask matrix 406 represents a frame in order of operation, and each column represents a specific detector in the block pixel. For each row (or frame), each value in the matrix 406 can be selected or not selected corresponding to a selection or non-selection of the associated detector in the block pixel. The Hadamard base mask matrix 406 is for illustration only, and other selection/deselection mask patterns can be used. As shown in FIG. 4F, a DCT mask matrix 408 can be used to identify information for each detector of a detector array.

Although FIGS. 4A through 4F illustrate examples of fovea and compressive (Hadamard) sampling, various changes may be made to FIGS. 4A through 4F. For example, the sizes, shapes, and dimensions of the fovea and compressive sampling can vary as needed or desired. Also, the fovea and compressive sampling may be used in any other suitable foveal process and is not limited to the specific processes described above.

Figure 5:
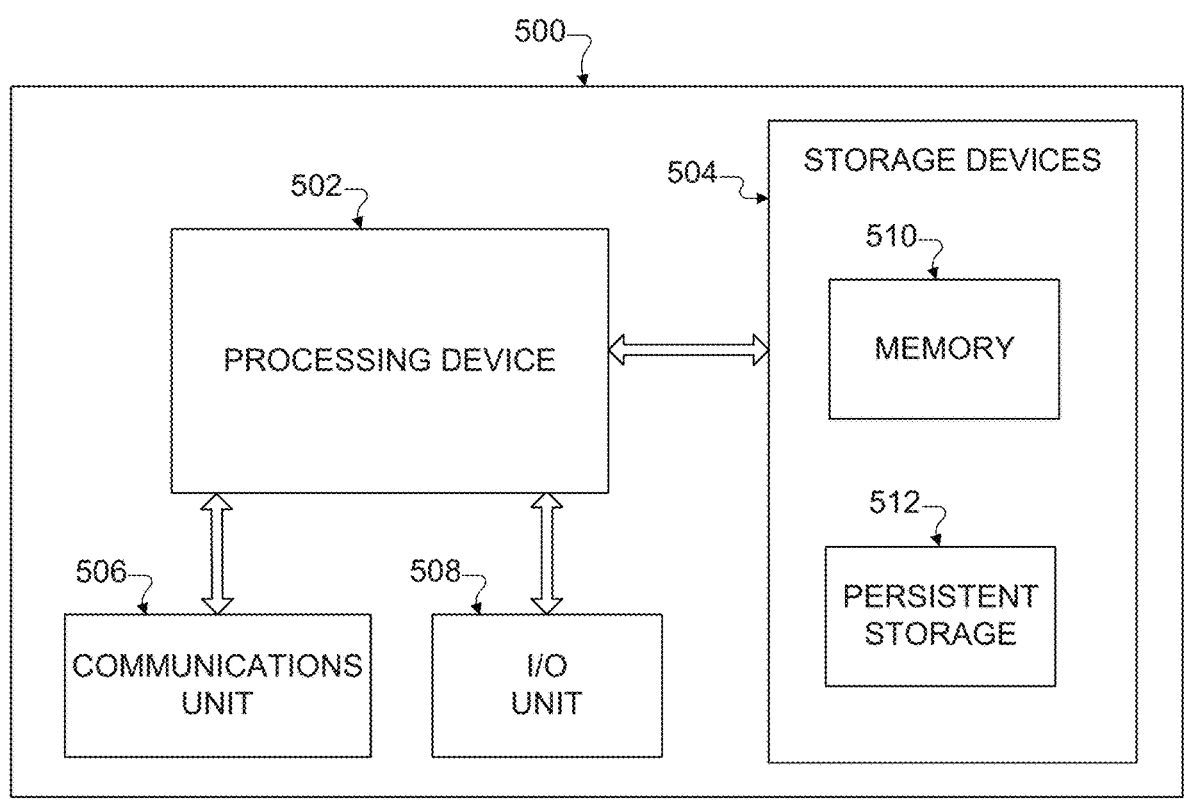
FIG. 5 illustrates an example device for foveal compressive upsampling for imaging devices and processes in accordance with this disclosure.

FIG. 5 illustrates an example device 500 for foveal compressive upsampling for imaging devices and processes in accordance with this disclosure. One or more instances of the device 500 (or portions thereof) may, for example, be used to at least partially implement the functionality of the system 200 of FIG. 2. However, the functionality of the device 500 may be implemented in any other suitable manner.

As shown in FIG. 5, the device 500 denotes a computing device or system that includes at least one processing device 502, at least one storage device 504, at least one communications unit 506, and at least one input/output (I/O) unit 508. The processing device 502 may execute instructions that can be loaded into a memory 510. The processing device 502 includes any suitable number(s) and type(s) of processors or other devices in any suitable arrangement. Example types of processing devices 502 include one or more microprocessors, microcontrollers, digital signal processors (DSPs), application specific integrated circuits (ASICs), field programmable gate arrays (FPGAs), or discrete circuitry.

The memory 510 and a persistent storage 512 are examples of storage devices 504, which represent any structure(s) capable of storing and facilitating retrieval of information (such as data, program code, and/or other suitable information on a temporary or permanent basis). The memory 510 may represent a random access memory or any other suitable volatile or non-volatile storage device(s). The persistent storage 512 may contain one or more components or devices supporting longer-term storage of data, such as a read only memory, hard drive, Flash memory, or optical disc.

The communications unit 506 supports communications with other systems or devices. For example, the communications unit 506 can include a network interface card or a wireless transceiver facilitating communications over a wired or wireless network. The communications unit 506 may support communications through any suitable physical or wireless communication link(s).

The I/O unit 508 allows for input and output of data. For example, the I/O unit 508 may provide a connection for user input through a keyboard, mouse, keypad, touchscreen, or other suitable input device. The I/O unit 508 may also send output to a display or other suitable output device. Note, however, that the I/O unit 508 may be omitted if the device 500 does not require local I/O, such as when the device 500 can be accessed remotely or operated autonomously.

In some embodiments, the instructions executed by the processing device 502 can include instructions that implement all or portions of the functionality of the system 200 described above. For example, the instructions executed by the processing device 502 can include instructions for foveal compressive upsampling for imaging devices and processes as described above.

Although FIG. 5 illustrates one example of a device 500 for foveal compressive upsampling for imaging devices and processes, various changes may be made to FIG. 5. For example, computing devices and systems come in a wide variety of configurations, and FIG. 5 does not limit this disclosure to any particular computing device or system.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a sensor comprising an array of detectors, the sensor configured to:
  assign multiple detectors to a detector group corresponding to a block pixel; and
  for each frame of a set of frames:
    apply a specified one of a set of mask patterns in order to select outputs of the detectors in the detector group; and
    aggregate the selected outputs of the detectors in the detector group to determine pixel information for the block pixel; and
at least one processor configured to:
  generate the frames using the pixel information for the block pixel; and
  upscale a portion of the at least one of the frames using the set of mask patterns to identify native pixels within the block pixel.

2. The apparatus of claim 1, wherein the sensor further comprises block-pixel logic configured to reconfigure the array of detectors between fovea sensing regions and compressive sensing regions.

3. The apparatus of claim 1, wherein the sensor is further configured to output the pixel information to the at least one processor without storing information related to individual ones of the detectors corresponding to the block pixel.

4. The apparatus of claim 1, wherein the sensor is further configured to output the pixel information to the at least one processor without outputting information related to individual ones of the detectors corresponding to the block pixel.

5. The apparatus of claim 1, wherein:
a number of the mask patterns is less than or equal to a number of the detectors; and
the mask patterns are repeatedly used in sequence.

6. The apparatus of claim 1, wherein values in the mask patterns are binary.

7. The apparatus of claim 1, wherein values in the mask patterns are in a range from −1 to +1.

8. The apparatus of claim 1, wherein:
the at least one processor is further configured to identify an abnormal spatio-temporal signature in at least one of the frames where the block pixel is located; and
the portion of the at least one frame that is upscaled corresponds to the abnormal spatio-temporal signature.

9. A method comprising:
receiving frame data from a sensor comprising an array of detectors, the sensor configured to:
assign multiple detectors to a detector group corresponding to a block pixel; and
for each frame of a set of frames:
apply a specified one of a set of mask patterns in order to select outputs of the detectors in the detector group; and
aggregate the selected outputs of the detectors in the detector group to determine pixel information for the block pixel;
generating the frames using the pixel information for the block pixel; and
upscaling a portion of the at least one of the frames using the set of mask patterns to identify native pixels within the block pixel.

10. The method of claim 9, wherein the sensor further comprises block-pixel logic configured to reconfigure the array of detectors between fovea sensing regions and compressive sensing regions.

11. The method of claim 9, wherein the sensor outputs the pixel information without storing information related to individual ones of the detectors corresponding to the block pixel.

12. The method of claim 9, wherein the sensor outputs the pixel information without outputting information related to individual ones of the detectors corresponding to the block pixel.

13. The method of claim 9, wherein:
a number of the mask patterns is less than or equal to a number of the detectors; and
the mask patterns are repeatedly used in sequence.

14. The method of claim 9, wherein values in the mask patterns are binary.

15. The method of claim 9, wherein values in the mask patterns are in a range from −1 to +1.

16. The method of claim 9, further comprising:
identifying an abnormal spatio-temporal signature in at least one of the frames where the block pixel is located;
wherein the portion of the at least one frame that is upscaled corresponds to the abnormal spatio-temporal signature.

17. A non-transitory computer readable medium containing instructions that when executed cause at least one processor to:
receive frame data from a sensor comprising an array of detectors, the sensor configured to:
assign multiple detectors to a detector group corresponding to a block pixel; and
for each frame of a set of frames:
apply a specified one of a set of mask patterns in order to select outputs of the detectors in the detector group; and
aggregate the selected outputs of the detectors in the detector group to determine pixel information for the block pixel;
generate the frames using the pixel information for the block pixel; and
upscale a portion of the at least one of the frames using the set of mask patterns to identify native pixels within the block pixel.

18. The non-transitory computer readable medium of claim 17, wherein the sensor further comprises block-pixel logic configured to reconfigure the array of detectors between fovea sensing regions and compressive sensing regions.

19. The non-transitory computer readable medium of claim 17, wherein the sensor does not store information related to individual ones of the detectors corresponding to the block pixel.

20. The non-transitory computer readable medium of claim 17, wherein the sensor does not output information related to individual ones of the detectors corresponding to the block pixel.

* * * * *